US 10,211,707 B2

(12) United States Patent
Yamanaka (10) Patent No.: US 10,211,707 B2
(45) Date of Patent: Feb. 19, 2019

(54) ELECTRONIC DEVICE AND ACTUATOR USING THE SAME (71) Applicant: DENSO CORPORATION, Kariya, Aichi-pref. (JP)

(72) Inventor: Takahiro Yamanaka, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 325 days.

(21) Appl. No.: 14/971,553

(22) Filed: Dec. 16, 2015

(65) Prior Publication Data
US 2016/0192535 A1 Jun. 30, 2016

(30) Foreign Application Priority Data
Dec. 26, 2014 (JP) ................. 2014-264427

(51) Int. Cl.
H01L 23/36 (2006.01)
H05K 7/20 (2006.01)
H02K 11/33 (2016.01)
H02K 9/22 (2006.01)
H01L 23/40 (2006.01)

(52) U.S. Cl.
CPC .............. H02K 11/33 (2016.01); H01L 23/36 (2013.01); H05K 7/20454 (2013.01); *H01L 2023/405* (2013.01); *H01L 2924/18301* (2013.01); H02K 9/22 (2013.01)

(58) Field of Classification Search
CPC .... H05K 7/20454–7/20472; H01L 2023/4081; H01L 2924/18301
See application file for complete search history.

(56) References Cited

U.S. PATENT DOCUMENTS

| 4,962,416 | A | * | 10/1990 | Jones | ................... H01L 23/057 257/722 |
| 5,014,777 | A | * | 5/1991 | Sano | ................... H01L 23/367 165/185 |
| 5,126,829 | A | * | 6/1992 | Daikoku | ............ H01L 23/4338 257/713 |
| 5,345,107 | A | * | 9/1994 | Daikoku | ................. F28F 13/00 165/185 |
| 5,745,344 | A | * | 4/1998 | Baska | ................. H01L 21/4871 165/185 |

(Continued)

FOREIGN PATENT DOCUMENTS

FR 3010489 A1 * 3/2015 ......... H05K 7/20454
JP H09-153576 6/1997
(Continued)

Primary Examiner — Robert J Hoffberg
(74) Attorney, Agent, or Firm — Knobbe, Martens, Olson & Bear, LLP (57) ABSTRACT An electronic device has a substrate, a heat sink, and a heat conductive material. The substrate has a first surface on which an electronic part is arranged. The heat sink has (i) a second surface facing the first surface and distanced from the electronic part and (ii) an annular groove extending annularly and defining an area that is circled by the annular groove on the second surface and faces the electronic part. The heat conductive material is arranged between the first surface and the second surface to be in contact with the electronic part and the annular groove. The heat conductive material guides heat generated by the electronic part to the heat sink.

5 Claims, 6 Drawing Sheets (56) References Cited

U.S. PATENT DOCUMENTS

| | | | | |
|---|---|---|---|---|
| 5,770,478 A * | 6/1998 | Iruvanti | H01L 21/4878 | 257/E23.103 |
| 5,825,087 A * | 10/1998 | Iruvanti | H01L 21/4878 | 257/706 |
| 5,877,043 A * | 3/1999 | Alcoe | H01L 23/13 | 257/E23.004 |
| 6,184,064 B1 * | 2/2001 | Jiang | H01L 24/32 | 257/739 |
| 6,261,404 B1 * | 7/2001 | Baska | H01L 21/4871 | 156/310 |
| 6,713,849 B2 * | 3/2004 | Hasebe | H01L 23/3107 | 257/667 |
| 6,774,482 B2 * | 8/2004 | Colgan | H01L 23/367 | 257/700 |
| 6,816,377 B2 * | 11/2004 | Itabashi | H05K 7/205 | 174/252 |
| 7,031,165 B2 * | 4/2006 | Itabashi | H05K 7/205 | 174/252 |
| 7,224,047 B2 * | 5/2007 | Carberry | H01L 23/4334 | 257/433 |
| 7,429,790 B2 * | 9/2008 | Condie | H01L 23/10 | 257/709 |
| 8,243,454 B2 * | 8/2012 | Oota | H01L 23/42 | 165/80.3 |
| 8,355,254 B2 * | 1/2013 | Oota | B62D 5/0406 | 174/520 |
| 9,392,732 B2 * | 7/2016 | Hara | H02K 5/22 | |
| 9,418,909 B1 * | 8/2016 | Chaware | H01L 24/32 | |
| 9,676,408 B2 * | 6/2017 | Tominaga | B62D 5/0406 | |
| 9,949,384 B2 * | 4/2018 | Yamanaka | H02K 11/0073 | |
| 2006/0215369 A1 * | 9/2006 | Ohashi | H01L 23/42 | 361/704 |
| 2006/0238984 A1 * | 10/2006 | Belady | H01L 23/367 | 361/704 |
| 2012/0229005 A1 * | 9/2012 | Tominaga | B62D 5/0406 | 310/68 B |
| 2016/0037659 A1 * | 2/2016 | Yamanaka | H02K 11/0073 | 310/68 R |
| 2017/0110384 A1 * | 4/2017 | Zhao | H01L 23/367 | |

FOREIGN PATENT DOCUMENTS

| | | | |
|---|---|---|---|
| JP | 2013138113 A | * | 7/2013 |
| JP | 2013-232654 A | | 11/2013 |

* cited by examiner

ELECTRONIC DEVICE AND ACTUATOR USING THE SAME

CROSS REFERENCE TO RELATED APPLICATION

This application is based on Japanese Patent Application No. 2014-264427 filed on Dec. 26, 2014, the disclosure of which is incorporated herein by reference in its entirety.

TECHNICAL FIELD

The present disclosure relates to an electronic device and an actuator using the same.

BACKGROUND

An electronic device is known to have a substrate, on which an electronic part is arranged, and a heat sink. A radiation gel as a heat conductive material is filled between the substrate and the heat sink such that heat, which is generated by the electronic part, transfers to the heat sink through the radiation gel. Such an electronic device is described in, for example, Patent Document 1 (JP 2013-232654 A). The electronic device described in Patent Document 1 has a heat sink of which surface has a protruding portion and a recessed portion to suppress a transfer of the radiation gel such that an adhesive force of the radiation gel with respect to the heat sink is improved.

However, according to studies conducted by the inventor of the present disclosure, the transfer of the radiation gel cannot be suppressed sufficiently by such a simple structure of the surface having the protruding portion and the recessed portion.

For example, in the electronic device, the radiation gel may be expanded, a warpage may be caused in the substrate, and the heat sink may be expanded by a variation of temperature. As a result, a volume of the radiation gel occupying a clearance that is defined between the substrate and the heat sink may increase relatively. When the volume of the radiation gel increases relatively, the radiation gel is pressed by the substrate and the heat sink and spreads between the substrate and the heat sink.

In a case where a clearance defined between the substrate and the heat sink is non-uniform, when the volume of the radiation gel varies repeatedly, the radiation gel transfers between the protruding portion and the recessed portion of the heat sink and transfers away from a position where the radiation gel is arranged initially. Accordingly, the radiation gel transfers away from the electronic part that is subjected to a heat radiation, and a heat radiational efficiency of the electronic part may decrease.

Furthermore, the electronic device vibrates, for example, when being mounted in a vehicle. In this case, the transfer of the radiation gel may not be suppressed by the simple structure of the surface having the protruding portion and the recessed portion. Thus, the heat radiational efficiency of the electronic part may decrease.

SUMMARY

The present disclosure addresses the above issues. Thus, it is an objective of the present disclosure to provide an electronic device in which a heat conductive material can reliably be in contact with an electronic part even when a temperature varies and when the electronic device vibrates and to provide an actuator having the electronic device.

An electronic device has a substrate, a heat sink, and a heat conductive material. The substrate has a first surface on which an electronic part is arranged. The heat sink has (i) a second surface facing the first surface and distanced from the electronic part and (ii) an annular groove extending annularly and defining an area that is circled by the annular groove on the second surface and faces the electronic part. The heat conductive material is arranged between the first surface and the second surface to be in contact with the electronic part and the annular groove. The heat conductive material guides heat generated by the electronic part to the heat sink.

An actuator has the electronic device and a rotational electric machine. The electronic device controls energization of the rotational electric machine. The rotation electric machine operates a load rotatably.

With the above-described structure, the second surface of the heat sink is uneven, in other words, has an irregularity, in a radial direction of the annular groove. When an external force is applied to the heat conductive material in the radial direction, a great frictional force is applied to the heat conductive material by the irregularity. That is, an adhesion force of the heat conductive material with respect to the second surface improves in the radial direction.

On the other hand, the second surface is even, in other words, has no irregularity, in a circumferential direction of the annular groove.

Accordingly, when an external force is applied to the heat conductive material in the circumferential direction, generally a weak frictional force is applied to the heat conductive material. That is, an adhesion force of the heat conductive material with respect to the second surface is generally weak in the circumferential direction.

Therefore, the heat conductive material is relatively resistant to transfer in the radial direction and easily transfers in the circumferential direction.

Then, a case is assumed. In the case, (i) a clearance that is defined between the first surface and the second surface is non-uniform, and (ii) an applying area, to which the heat conductive material is applied, includes a large area in which the clearance is relatively large and a small area in which the clearance is relatively small.

When a volume of the heat conductive material increases relatively, the heat conductive material transfers from the small area to the large area in the circumferential direction rather than from an inner side to an outer side of the annular groove in the radial direction. That is, the heat conductive material is guided by the annular groove not to transfer away from the applying area in which the heat conductive material can be in contact with the electronic part. When the volume of the heat conductive material decreases to an initial volume, the heat conductive material transfers along the annular groove in the circumferential direction to an initial position.

Thus, even when the volume of the heat conductive material varies repeatedly, the heat conductive material is prevented from being distanced from the electronic part.

The same effect can be produced by the annular groove even when the heat conductive material transfers by a vibration of the electronic device.

Therefore, according to the present disclosure, the heat conductive material can be in contact with the electronic part reliably even when a temperature varies and when the electronic device vibrates.

BRIEF DESCRIPTION OF THE DRAWINGS

The above and other objects, features and advantages of the present disclosure will become more apparent from the following detailed description made with reference to the accompanying drawings.

DETAILED DESCRIPTION

An electronic device of the present embodiment is used in an actuator. Hereafter, an actuator 1 will be described referring to FIGS. 1 to 4.

The actuator 1 is used, for example, for an electric power steering device. The electric power steering device assists a steering operation by a driver by transmitting a steering assist torque that is output from the actuator 1 to a column or a rack through a reduction gear.

(Configuration of the Actuator)

Figure 1:
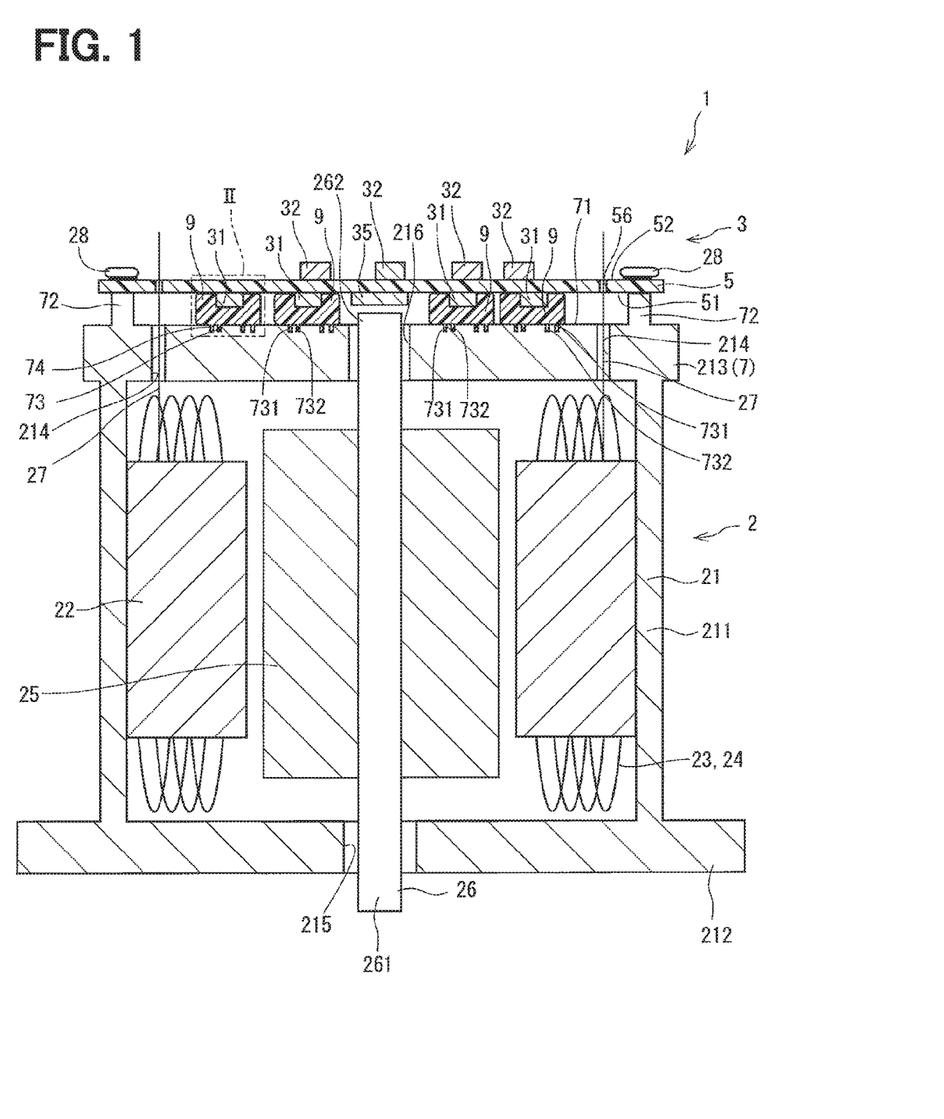
FIG. 1 is a sectional view schematically illustrating an actuator of an embodiment.

A schematic configuration of the actuator 1 will be described referring to FIG. 1.

The actuator 1 has a motor 2 as a rotating electric machine and a controller 3 as the electronic device controlling an energization of the motor 2. The controller 3 is arranged on one side of the motor 2 in an axial direction of the motor 2, and the motor 2 and the controller 3 are formed into one whole. The axial direction of the motor 2 will be hereinafter referred to as just the axial direction.

The motor 2 is, for example, a three-phase brushless motor and has a motor case 21, a stator 22, and two pairs of windings 23, 24, a rotor 25, and a shaft 26.

The motor case 21 is made of a metallic material such as aluminum and has a bottomed cylindrical shape. The motor case 21 has a cylinder portion 211 and two bottom portions 212, 213 that are arranged at an opening of the cylinder portion 211. The bottom portions 212, 213 respectively have bearing holes 215, 216 generally at a center of the bottom portions 212, 213. A bearing (not shown) is arranged in each of the bearing holes 215, 216.

The stator 22 is fixed inside of the motor case 21, and the two pairs of windings 23, 24 that are connected by a three-phase connection are wound around the stator 22. A motor wire 27 extends from each phase of each pair of the windings 23, 24. The motor wire 27 extends to an outside of the motor case 21 through a through hole 214 defined in the bottom portion 213 of the motor case 21. The rotor 25 is arranged concentrically with the stator 22 on a radial-inner side of the stator 22 in a radial direction of the motor 2.

The shaft 26 is fixed to the rotor 25 at a central axis of the rotor 25. The shaft 26 is received and rotatably supported by the bearing (not shown) arranged in the bottom portions 212, 213 of the motor case 21.

The shaft 26 has one end 261 and the other end 262 in the axial direction.

The one end 261 passes through the bearing hole 215 defined in the bottom portion 212 and protrudes to an outside of the motor case 21. An output terminal (not shown) is disposed to the one end 261. The other end 262 of the shaft 26 passes through the bearing hole 216 defined in the bottom portion 213 and is exposed on the one side of the motor case 21 on which the controller 3 is arranged. A magnet (not shown) used to detect a rotation angle is supported at the other end 262.

The controller 3 has a substrate 5 on which electronic parts 31, 32 are mounted, a heat sink 7, and a radiation gel 9 as a heat conductive material. The heat sink 7 is unified with the bottom portion 213 of the motor case 21 into one whole.

The substrate 5 is, for example, a printed circuit board. The substrate 5 is arranged perpendicular to the axial direction to face the heat sink 7. The substrate 5 has two main surfaces. One of the two main surface facing the heat sink 7 will be referred to as a first main surface (i.e., a first surface) 51, and the other of the two main surface will be referred to as a second main surface 52. The first main surface 51 corresponds to a first surface of the present disclosure.

The electronic part 31 mounted on the first main surface 51 is a switching element such as MOSFET that configures each inverter corresponding to each pair of the windings 23, 24. The electronic part 32 mounted on the second main surface 52 is a capacitor, a choke coil or the like. The electronic parts 31, 32 are mounted on a single substrate 5. Accordingly, a quantity of members can be reduced, and the controller 3 can be downsized, as compared to a case where the controller 3 has plural substrates.

A rotation angle sensor 35 detecting a rotation angle is mounted on the first main surface 51. The rotation angle sensor 35 faces the magnet (not shown) supported at the other end 262 of the shaft 26.

The substrate 5 further has a through hole 56 for the motor wire 27. The motor wire 27 of the motor 2 extends through the through hole 56 and electrically connects to the substrate 5.

The heat sink 7 is made of a metallic material such as aluminum having a great heat conductivity. The heat sink 7 faces the first main surface 51 of the substrate 5 such that a clearance is defined between the heat sink 7 and the electronic part 31. The surface of the heat sink 7 that faces the first main surface 51 of the substrate 5 will be referred to as an opposite surface (i.e., a second surface) 71.

The opposite surface 71 has a substrate supporting part 72 that protrudes from the opposite surface 71. A screw 28 fixes the substrate 5 and the substrate supporting part 72 to each other, for example.

The opposite surface 71 further has an annular groove 73 and an annular groove 74 for each electronic part 31.

Figure 2:
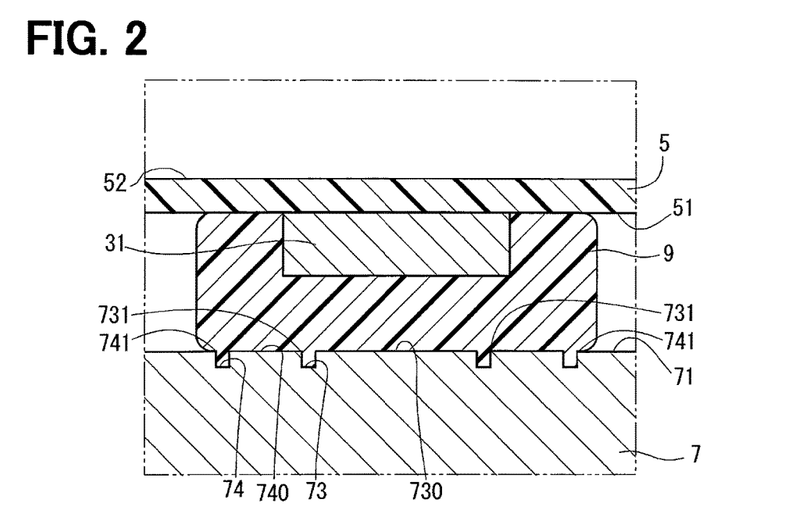
FIG. 2 is a partial enlarged view of a portion II that is shown in FIG. 1.

The radiation gel 9 as the heat conductive material fills a clearance defined between the first main surface 51 of the substrate 5 and the opposite surface 71 of the heat sink 7 to be in contact with the electronic part 31 and the annular grooves 73, 74. The radiation gel 9 is made of a heat conductive material of which main component is, for example, a silicon and capable of transferring heat generated by the electronic part 31 to the heat sink 7. The radiation gel 9 has a great electric resistivity and is basically an insulator.

The radiation gel 9 is applied to a specified area of the substrate 5 (or the heat sink 7), in which the radiation gel 9 can be in contact with the electronic part 31, not to all area of the substrate 5 (or the heat sink 7).

(Annular Groove)

The annular grooves 73, 74 will be described referring to FIGS. 2 and 3. In the present embodiment, multiple electronic parts 31 are mounted on the first main surface 51, and multiple pairs of grooves 73, 74 are defined in the opposite surface 71 for each electronic part 31.

In the following description, one pair of annular grooves 73, 74, which corresponds to one electronic part 31, will be described. However, it should be noted that another pair of annular grooves 73, 74 corresponding to another electronic part 31 has the same feature.

Figure 3:
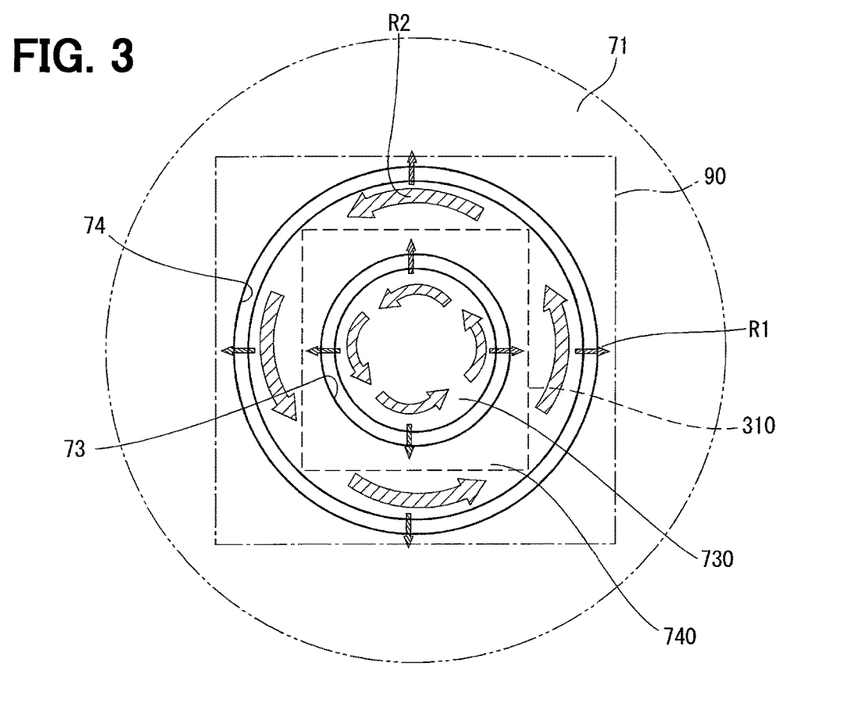
FIG. 3 is an enlarged plane view illustrating a surface of a heat sink.

In FIG. 3, a facing area 310 facing the electronic part 31 is shown by a dash line, and an applying area 90 to which the radiation gel 9 is applied is shown by a chain line. In the present embodiment, as shown in FIG. 3, the facing area 310 is included (i.e., located) in the applying area 90.

The annular grooves 73, 74 are provided on the opposite surface 71 of the heat sink 7 at a position corresponding to each electronic part 31. The annular grooves 73, 74 extend annularly and have a ring shape. The annular grooves 73, 74 define areas 730, 740 that are respectively circled by the annular grooves 73, 74 and face the electronic parts 31. In other words, the areas 730, 740 are radial inner area of the annular grooves 73, 74 on the opposite surface 71. Hereafter, a radial direction of a circle that is defined by the annular grooves 73, 74 (i.e., an outer line of the annular grooves 73, 74) will be referred to as the radial direction. The radial direction corresponds to a groove width direction of the annular grooves 73, 74.

A groove depth of the annular grooves 73, 74 is in a range having no effect on a heat radiation of the electronic parts 31.

A center of the circle that is defined by the annular groove 73 and a center of the circle that is defined by the annular groove 74 are positioned generally the same to each other. That is, the annular groove 73 and the annular groove 74 are positioned generally concentrically. The annular groove 73 and the annular groove 74 are different from each other in size (i.e., in length in a circumferential direction of the annular grooves 73, 74). The annular groove 73 is smaller (i.e., shorter) than the annular groove 74. The annular groove 73 is positioned in the facing area 310 facing the electronic part 31. The annular groove 74 is positioned on an outer side of the facing area 310 and on an in the applying area 90 to which the radiation gel 9 is applied.

The opposite surface 71 of the heat sink 7 is uneven, in other words, has an irregularity, in the radial direction (i.e., a direction shown by an arrow R1 in FIG. 3) by the annular grooves 73, 74. For example, when an external force is applied to the radiation gel 9 toward a radial outer side, a great frictional force is applied to the radiation gel 9 due to the irregularity. Specifically, the great frictional force is applied to the radiation gel 9 by corner portions 731, 741 that are defined by a radial outer periphery of the annular grooves 73, 74 (refer FIG. 2). Thus, an adhesion force of the radiation gel 9 with respect to the opposite surface 71 of the heat sink 7 improves in the radial direction.

On the other hand, the opposite surface 71 is even, in other words, has no irregularity, in the circumferential direction of the annular grooves 73, 74 (i.e., an extension direction shown by an arrow R2 in FIG. 3). Accordingly, when an external force is applied to the radiation gel 9 in the circumferential direction, generally a weak frictional force is applied to the radiation gel 9. That is, an adhesion force of the radiation gel 9 with respect to the opposite surface 71 is generally weak in the circumferential direction.

Therefore, the radiation gel 9 is relatively resistant to transfer in the radial direction and easily transfers in the circumferential direction. Although a direction pointed by the arrow R2 is a counterclockwise direction in FIG. 3, the direction may be an opposite direction (i.e., a clockwise direction).

(Guiding the Radiation Gel)

A guiding effect on the radiation gel 9 by the annular grooves 73, 74 will be described hereafter referring to FIGS. 4 and 5.

In the actuator 1, the radiation gel 9 may be expanded, a warpage may be caused in the substrate 5, and the heat sink 7 may be expanded by temperature variation. As a result, a volume of the radiation gel 9 that occupies the clearance defined between the first main surface 51 of the substrate 5 and the opposite surface 71 of the heat sink 7 may increase relatively. When the volume of the radiation gel 9 increases relatively, the radiation gel 9 is pressed by the first main surface 51 of the substrate 5 and the opposite surface 71 of the heat sink 7 and spreads between the substrate 5 and the heat sink 7.

Figure 4:
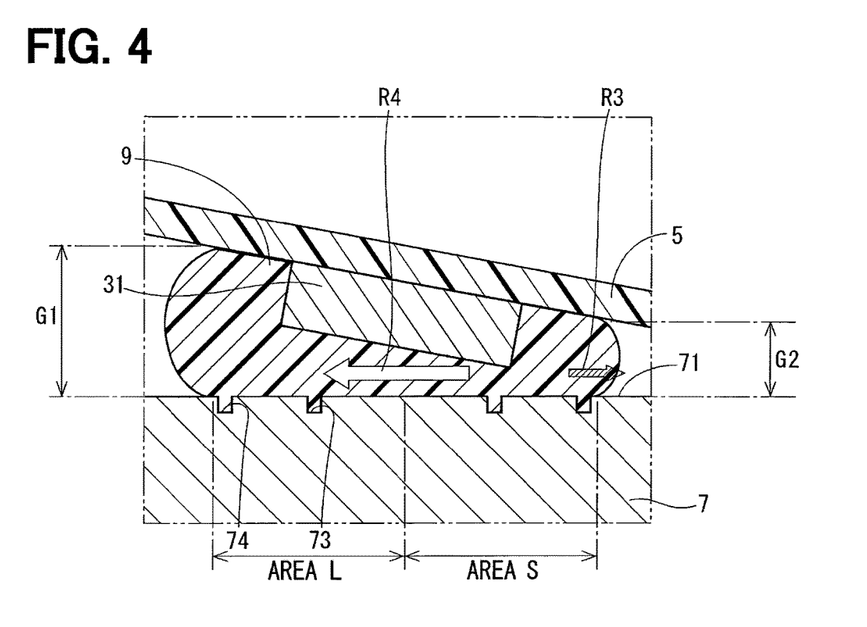
FIG. 4 is a partial enlarged view illustrating a condition where a clearance between a substrate and the heat sink varies un-uniformly.
Figure 5:
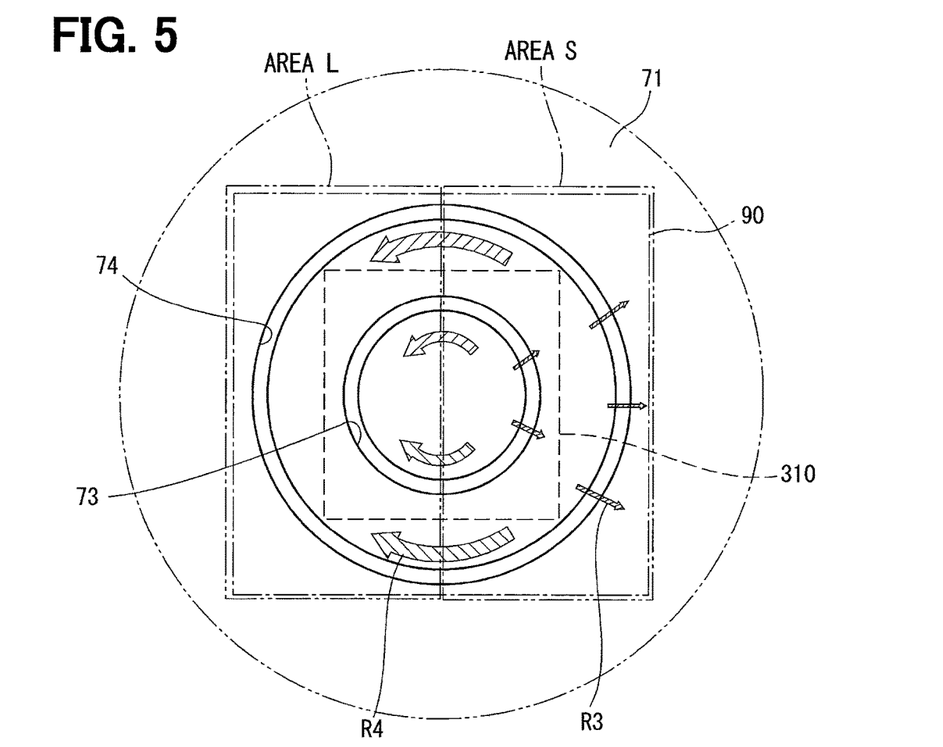
FIG. 5 is an enlarged plane view illustrating the surface of the heat sink and explaining a move of a radiation gel.

FIGS. 4 and 5 show an example in which (i) a clearance G that is defined between the first main surface 51 and the opposite surface 71 is non-uniform, and (ii) the applying area 90 includes a large area in which the clearance G1 is relatively large and a small area in which the clearance G2 is relatively small. Hereafter, the large area will be referred to as an area L, and the small area will be referred to as an area S.

When the volume of the radiation gel 9 increases relatively, the radiation gel 9 in the area S transfers in the circumferential direction of the annular grooves 73, 74 toward the area L rather than from an inner side to an outer side of the annular grooves 73, 74 in the radial direction as shown by an arrow R3. That is, the radiation gel 9 is guided by the annular grooves 73, 74 not to transfer away from the applying area 90 in which the radiation gel 9 can be in contact with the electronic part 31. The radiation gel 9 transfers along the annular grooves 73, 74 in the circumferential direction to an initial position when the volume of the radiation gel 9 decreases to an initial volume.

Thus, even when the volume of the radiation gel 9 varies repeatedly, the radiation gel 9 is prevented from being distanced from the electronic part 31.

Although the clearance G is non-uniform and the volume of the radiation gel 9 (i.e., the heat conductive material) relatively increases or decreases in the above-described example referring to FIGS. 4 and 5, the same effect provided by the above-described example can be provided in a case where the radiation gel 9 transfers by a vibration of the actuator 1.

Figure 10:
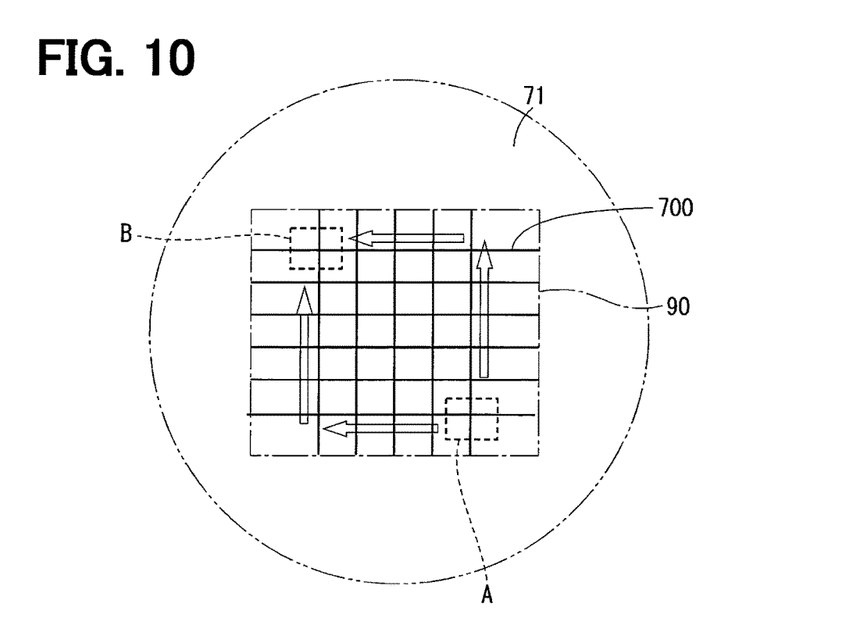
FIG. 10 is a schematic diagram illustrating a lattice groove of a comparison example.

FIG. 10 shows a comparison example in which the opposite surface 71 has a lattice groove 700 instead of the annular grooves 73, 74. When the radiation gel 9 transfers from an area to another area (e.g., from an area A to an area B in FIG. 10) in a direction that is not parallel with an extending direction of the lattice groove 700, the radiation gel 9 passes through an intersection in which two groove portions of the lattice groove 700 intersect with each other. Accordingly, the radiation gel 9 is resistant to transfer on the opposite surface 71. That is, according to the comparison example, the radiation gel 9 is guided insufficiently. Accordingly, the radiation gel 9 may transfers away from the electronic part 31, and a heat radiational efficiency of the electronic part 31 may decrease.

In contrast, according to the present embodiment, the radiation gel 9 can be in contact with the electronic part 31 reliably even when a temperature varies and when the actuator 1 vibrates.

Moreover, according to the present embodiment, the annular grooves 73, 74 extend annularly. As a result, the radiation gel 9 can be easily guided in any direction.

In addition, since the opposite surface 71 has plural annular grooves 73, 74, the radiation gel 9 can be guided effectively as compared to a case having a single annular groove.

The annular grooves 73, 74 are recessed from the opposite surface 71 of the heat sink 7. Accordingly, when a warpage is caused in the substrate 5, there is a less possibility that the electronic part 31 and the opposite surface 71 come into contact with each other as compared to a case where the opposite surface 71 has a protruding portion and a recessed portion as described in Patent Document 1.

When the actuator 1 is used for an electric power steering device, a temperature of the actuator 1 may vary, or the actuator 1 may vibrate, since the electric power steering device is mounted in a vehicle. According to the present embodiment, the electronic parts 31 can radiate heat certainly, even when a temperature of the actuator 1 varies or the actuator 1 vibrates. Therefore, the actuator 1 can be used reliably for the electric power steering device.

(Other Modifications)

(1) An annular groove positioned between protruding portions

Figure 6:
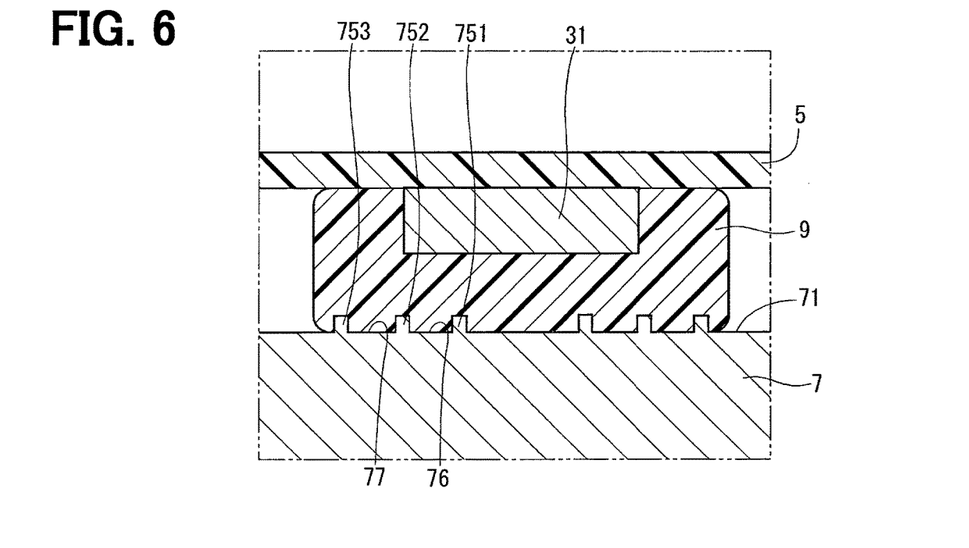
FIG. 6 is a schematic view illustrating an annular groove of a modification example.

In the above-described embodiment, the annular grooves 73, 74 are defined by cutting the opposite surface 71 of the heat sink 7 to have a recessed shape. However, for example, the opposite surface 71 may have protruding portions 751, 752, 753 extending annularly as shown in FIG. 6. In this case, an annular groove 76 is defined between the protruding portion 751 and the protruding portion 752, and an annular groove 77 is defined between the protruding portion 752 and the protruding portion 753. The annular grooves 76, 77 can guide the radiation gel 9 similar to the above-described embodiment.

(2) A Sidewall Surface of the Annular Groove

A sidewall surface of the annular grooves 73, 74, 76, 77 may incline with respect to the axial direction. With such a structure, a greater frictional force is applied to the radiation gel 9 as compared to a structure in which the sidewall surface does not incline with respect to the axial direction. Accordingly, the transfer of the radiation gel 9 toward a side away from the electronic part 31 can be suppressed more effectively.

Figure 7:
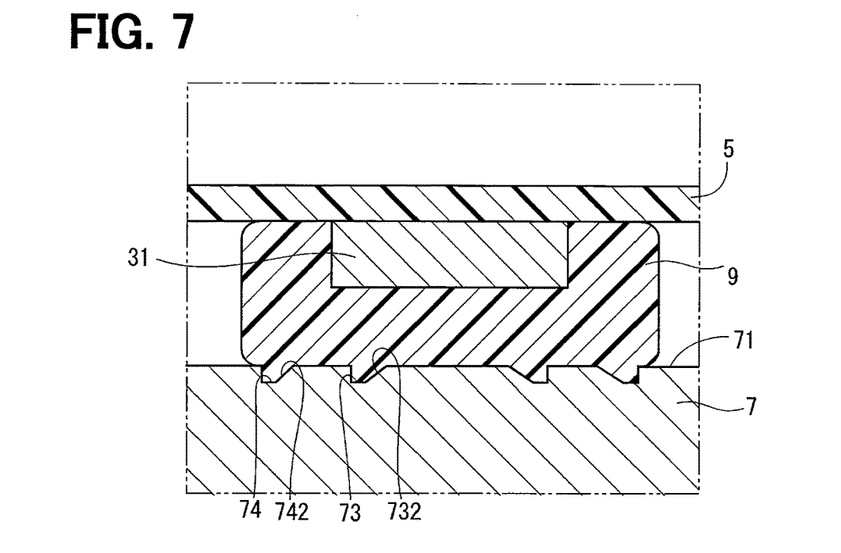
FIG. 7 is a schematic view illustrating an annular groove of a modification example.

Specifically, as shown in FIG. 7, the sidewall surface of the annular grooves 73, 74 may have radial-inner sidewall surfaces 732, 742 that is located on a radial inner side in the annular grooves 73, 74. The radial-inner sidewall surfaces 732, 742 incline with respect to the axial direction radial inward from a bottom side to an opening side. In other words, the radial-inner sidewall surfaces 732, 742 incline with respect to the axial direction such that a bottom end of the radial-inner sidewall surfaces 732, 742 is located on a radial-outer side of an opening end of the radial-inner sidewall surfaces 732, 742, which is opposite to the bottom end in the axial direction, in the radial direction.

Figure 8:
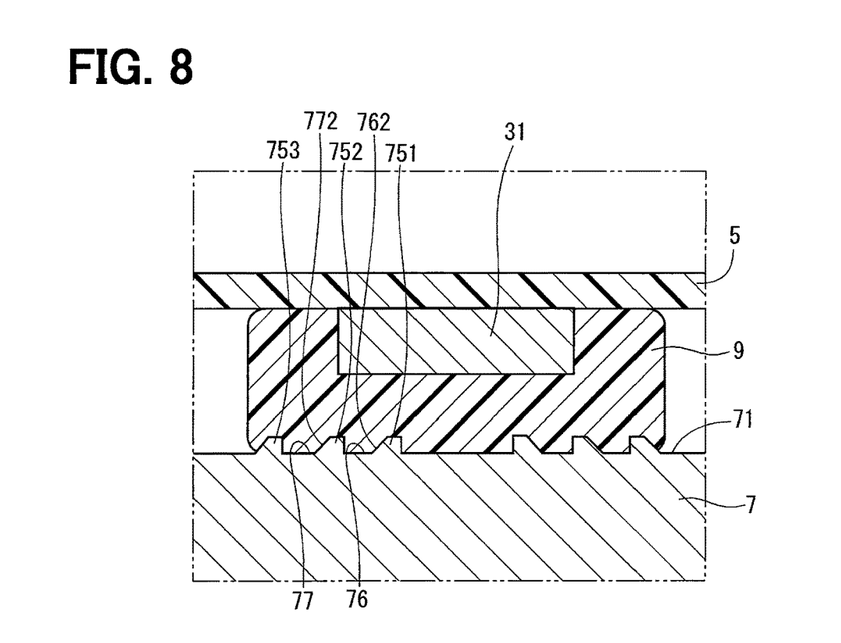
FIG. 8 is a schematic view illustrating an annular groove of a modification example.

Similarly, as shown in FIG. 8, the sidewall surface of the annular grooves 76, 77 may have radial-inner sidewall surfaces 762, 772. The radial-inner sidewall surfaces 762, 772 incline with respect to the axial direction radial inward from a bottom side to an opening side. In other words, the radial-inner sidewall surfaces 762, 772 incline with respect to the axial direction such that a bottom end of the radial-inner sidewall surfaces 762, 772 is located on a radial-outer side of an opening end of the radial-inner sidewall surfaces 762, 772, which is opposite to the bottom end in the axial direction, in the radial direction.

With such a structure, when the volume of the radiation gel 9 decreases after expanding and spreading to an outside of the applying area 90, the radiation gel 9 smoothly transfers to the initial position. Accordingly, the radiation gel 9 can be prevented from transferring away from the electronic part 31 and from being divided into parts including a part that is left on the outer side of the applying area 90.

Figure 9:
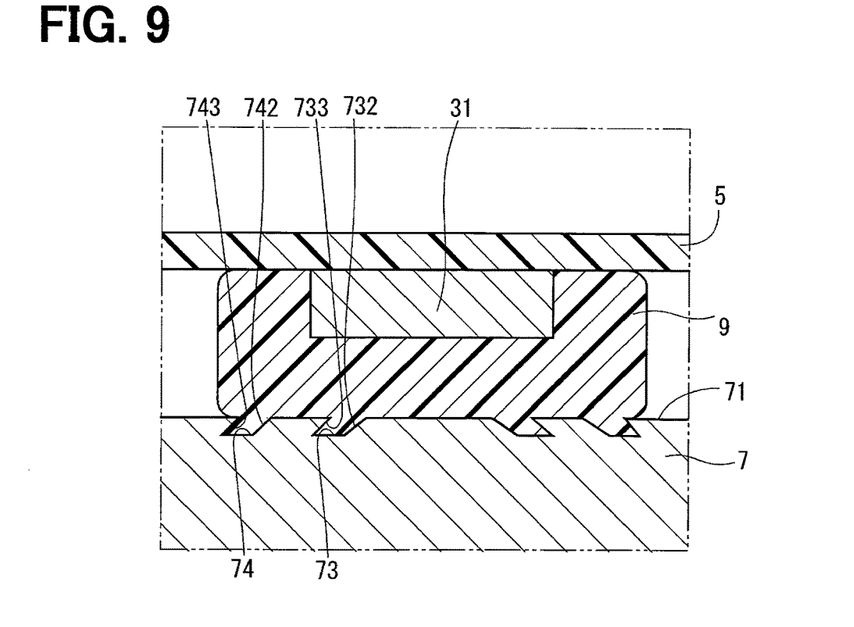
FIG. 9 is a schematic view illustrating an annular groove of a modification example.

As shown in FIG. 9, the sidewall surface of the annular grooves 73, 74 may have radial-outer sidewall surfaces 733, 743 in addition to the radial-inner sidewall surfaces 732, 742. The radial-outer sidewall surfaces 733, 743 incline with respect to the axial direction radial inward from a bottom side to an opening side. In other words, the radial-outer sidewall surfaces 733, 743 incline with respect to the axial direction such that a bottom end of the radial-outer sidewall surfaces 733, 743 is located on a radial-outer side of an opening end of the radial-outer sidewall surfaces 733, 743, which is opposite to the bottom end in the axial direction, in the radial direction.

With such a structure, a greater frictional force is applied to the radiation gel 9 as compared to a structure in which the side wall surface does not incline with respect to the axial direction. Accordingly, the transfer of the radiation gel 9 toward a side away from the electronic part 31 can be suppressed more effectively. Only the radial-outer sidewall surfaces 733, 743 of the annular grooves 73, 74 may incline with respect to the axial direction. Similarly, only radial-outer sidewall surfaces of the annular grooves 76, 77 may incline with respect to the axial direction.

The sidewall surface of the annular grooves 73, 74 may incline radial outward with respect to the axial direction. That is, the sidewall surface of the annular grooves 73, 74, 76, 77 may incline such that the bottom end of the sidewall surface is located on a radial-inner side of an opening end of the sidewall surface, which is opposite to the bottom end in the axial direction, in the radial direction.

(3) A shape and a quantity of the annular groove The annular grooves 73, 74, 76, 77 are not limited to have the circular shape and may have any shape.

A quantity of the annular grooves 73, 74, 76, 77 is two with respect to a single electronic part 31 in the above-described embodiment. However, the quantity of the annular grooves 73, 74, 76, 77 may be one or may be more than or equal to three.

(4) The Radiation gel

In the above-described embodiment, the radiation gel 9 is applied to a specified area in which the radiation gel 9 can be in contact with a single electronic part 31. However, the specified area may be set such that the radiation gel 9 can be in contact with plural electronic parts 31 in the single specified area. In this case, the annular grooves 73, 74, 76, 77 may be defined for each electronic part 31.

In the above-described embodiment, the radiation gel 9 covers the electronic part 31 entirely. However, the radiation gel 9 may cover a heat radiating portion such as a heat radiating plate that is a part of the electronic part 31. In this case, the facing area 310 that faces the electronic part 31 may be a facing area that faces the heat radiating portion of the electronic part 31.

(5) The Actuator and The Electronic Device

As a modification of the present disclosure, the actuator 1 may be used for another device that is different from the electronic power steering device. The electronic device of the present disclosure is not limited to the controller 3 of the actuator 1 and may be another electronic device.

Such changes and modifications are to be understood as being within the scope of the present disclosure as defined by the appended claims.

What is claimed is:

1. An electronic device comprising:
    a substrate having a first surface on which a plurality of electronic parts are arranged;
        a heat sink that has a second surface facing the first surface and distanced from the plurality of electronic parts, each of the electronic parts associated with:
    (i) an outer annular groove extending annularly in the second surface and defining an outer area that is circled by the outer annular groove on the second surface, the outer area facing a corresponding one of the electronic parts, the outer annular groove is only outside of a footprint of the corresponding one of the electronic parts;
    (ii) an inner annular groove extending annularly in the second surface and defining an inner area that is circled by the inner annular groove on the second surface, the inner area facing the corresponding one of the electronic parts, the inner annular groove is only inside the footprint of the corresponding one of the electronic parts;
    (iii) a heat conductive material that is arranged between the first surface and the second surface to be in contact with the corresponding one of the electronic parts, the outer annular groove, and the inner annular groove, the heat conductive material guiding heat generated by the corresponding one of the electronic parts to the heat sink; and
    (iv) an application area on the second surface, configured for application of the heat conductive material, the application area encompassing the outer area, and a projected view of the application area overlaps the inner annular groove and the outer annular groove.

2. The electronic device according to claim 1, wherein the outer annular groove extends to have a ring shape and the inner annular groove extends to have a ring shape.

3. The electronic device according to claim 1, wherein the outer annular groove or the inner annular groove has a sidewall surface that inclines with respect to a direction perpendicular to the second surface.

4. The electronic device according to claim 3, wherein
    the sidewall surface includes a bottom end and an opening end that are opposite to each other in the direction perpendicular to the second surface, and
    the bottom end is located on a radial outer side of the opening end in a radial direction of the outer annular groove or the inner annular groove.

5. An actuator comprising:
    the electronic device according to claim 1; and
    a rotational electric machine of which energization is controlled by the electronic device, the rotation electric machine operating a load rotatably.

* * * * *